United States Patent
Song et al.

(10) Patent No.: US 11,223,021 B2
(45) Date of Patent: *Jan. 11, 2022

(54) LIGHTING APPARATUS USING ORGANIC LIGHT EMITTING DEVICE AND METHOD OF FABRICATING THE SAME

(71) Applicant: LG DISPLAY CO., LTD., Seoul (KR)

(72) Inventors: Tae-Joon Song, Paju-si (KR); Sung-Hee Kim, Paju-si (KR); Jong-Min Kim, Pyeongtaek-si (KR)

(73) Assignee: LG DISPLAY CO., LTD., Seoul (KR)

(*) Notice: Subject to any disclaimer, the term of this patent is extended or adjusted under 35 U.S.C. 154(b) by 204 days.

This patent is subject to a terminal disclaimer.

(21) Appl. No.: 16/001,576

(22) Filed: Jun. 6, 2018

(65) Prior Publication Data
US 2019/0019975 A1 Jan. 17, 2019

(30) Foreign Application Priority Data
Jul. 11, 2017 (KR) .......................... 10-2017-0088074

(51) Int. Cl.
*H01L 51/52* (2006.01)
*G09G 3/3233* (2016.01)
(Continued)

(52) U.S. Cl.
CPC ....... *H01L 51/5203* (2013.01); *G09G 3/3208* (2013.01); *G09G 3/3233* (2013.01);
(Continued)

(58) Field of Classification Search
CPC ............. H01L 51/5203; H01L 51/0034; H01L 51/0045; H01L 2251/5361; G09G 3/3208;
(Continued)

(56) References Cited

U.S. PATENT DOCUMENTS

2009/0135146 A1* 5/2009 Scholz ................... G06F 3/044
345/173
2014/0034920 A1* 2/2014 Lee ..................... H01L 51/5212
257/40
(Continued)

FOREIGN PATENT DOCUMENTS

CN    106463642 A    2/2017
CN    106575662 A    4/2017
(Continued)

*Primary Examiner* — Georgia Y Epps
*Assistant Examiner* — Don J Williams
(74) *Attorney, Agent, or Firm* — Birch, Stewart, Kolasch & Birch, LLP

(57) ABSTRACT

A lighting apparatus according to an embodiment of the present invention includes an organic light emitting device including a first electrode, an organic light emitting layer, and a second electrode formed on a first substrate, wherein the first electrode is formed of a transparent conductive material having a resistance of approximately 2800Ω to 5500Ω in each pixel. Thus, even if the resistance of the organic light emitting layer is removed in a pixel due to a contact between the first electrode and the second electrode, overcurrent may be prevented from being applied to the pixel due to the resistance of the first electrode.

13 Claims, 12 Drawing Sheets

(51) Int. Cl.
*G09G 3/3208* (2016.01)
*H01L 51/00* (2006.01)

(52) U.S. Cl.
CPC ...... *H01L 51/5212* (2013.01); *H01L 51/5228* (2013.01); *G09G 2300/0426* (2013.01); *G09G 2300/088* (2013.01); *G09G 2320/0233* (2013.01); *H01L 51/0034* (2013.01); *H01L 51/0045* (2013.01); *H01L 2251/5361* (2013.01)

(58) Field of Classification Search
CPC ......... G09G 3/3233; G09G 2300/0426; G09G 2300/088; G09G 2320/0233
See application file for complete search history.

(56) References Cited

U.S. PATENT DOCUMENTS

2016/0043161 A1\* 2/2016 Miyazawa .......... H01L 27/3246
257/40
2019/0019980 A1\* 1/2019 Song .................... H01L 51/524

FOREIGN PATENT DOCUMENTS

| JP | 2014-82191 A | 5/2014 |
| JP | 2015-158981 A | 9/2015 |
| KR | 10-2015-0129585 A | 11/2015 |
| KR | 10-2015-0132032 A | 11/2015 |

\* cited by examiner

LIGHTING APPARATUS USING ORGANIC LIGHT EMITTING DEVICE AND METHOD OF FABRICATING THE SAME

This application claims the priority benefit of Korean Patent Application No. 10-2017-0088074 filed on Jul. 11, 2017 in Republic of Korea, which is hereby incorporated by reference as if fully set forth herein.

BACKGROUND OF THE INVENTION

Field of the Invention

The present invention relates to a lighting apparatus in which defects caused by a short circuit are prevented and a method of fabricating the same.

Discussion of the Related Art

Fluorescent lamps and incandescent lamps are mainly used as lighting apparatuses at present. Among them, incandescent lamps have a good color rendering index, but have low energy efficiency. Fluorescent lamps have high efficiency but have a low color rendering index and contain mercury, which causes environmental problems.

In order to solve the issues of the conventional lighting apparatuses, a light emitting diode (LED) has recently been proposed as a lighting apparatus. The LED is composed of an inorganic light emitting material. The LED has the highest light emission efficiency in the blue wavelength range, and the light emission efficiency thereof is lowered as the wavelength range is shifted toward the wavelength range of red and the wavelength range of green, which is the color exhibiting the highest visibility. Accordingly, when white light is emitted by combining the red light emitting diode, the green light emitting diode, and the blue light emitting diode, light emission efficiency is lowered. Further, when the red light emitting diode, the green light emitting diode, and the blue light emitting diode are used, the width of the emission peak of each LED is narrow, and color rendering index is deteriorated.

In order to address these issues, a lighting apparatus configured to output white light by combining a blue light emitting diode and a fluorescent material of yellow color, instead of combining the red light emitting diode, the green light emitting diode and the blue light emitting diode, has been proposed. This is because using only the blue light emitting diode having higher efficiency than the other light emitting diodes and employing a fluorescent material that emits yellow light upon receiving blue light is more efficient than using the green LED having a low light emission efficiency.

However, even in the case of the lighting apparatus that outputs white light by combining the blue LED and the fluorescent material of yellow color, the fluorescent material emitting yellow light has poor light emission efficiency, and therefore improvement in the light emission efficiency of the lighting apparatus is limited.

In order to address the issue of degradation of the light emission efficiency as described above, a lighting apparatus employing an organic light emitting device composed of an organic light emitting material has been proposed. Generally, the organic light emitting device has a relatively good light emission efficiency for green and red compared to the inorganic light emitting device. In addition, since the width of the emission peak of blue, red and green of the organic light emitting device is greater than that of the inorganic light emitting device, the light emitting apparatus can provide light more similar to sunlight with an improved color rendering index of the light emitting device.

The organic light emitting device includes an anode, a cathode, and an organic light emitting layer arranged therebetween. However, since the distance between the anode and the cathode is short, the organic light emitting device used in the lighting apparatus may have pinholes and cracks due to infiltration of foreign substances, and the step of the internal structure of the organic light emitting device and roughness of the laminated layers may bring the anode and the cathode into direct contact with each other, resulting in short-circuit of the anode and the cathode. Further, when the organic light emitting layer is formed, the organic light emitting layer may have a thickness less than the set thickness due to process failure, process error, or the like, thereby causing the anode and the cathode to be electrically short-circuited.

When the anode and the cathode are short-circuited, the short-circuited region forms a low-resistance path through which current flows, and thus current flows only to the short-circuiting region and the current flowing through the other region of the organic light emitting device is greatly reduced or even cut off. As a result, the light emission output power of the organic light emitting device decreases or light is never emitted from the organic light emitting device.

When such organic light emitting devices are applied to a lighting apparatus, light having luminance less than the set luminance may be output due to short-circuit of the anode and the cathode. Thereby, the quality of the lighting apparatus is lowered or the lighting apparatus fails operate. In addition, when the organic light emitting device is applied to a display apparatus, a pixel corresponding to a short-circuited region becomes a defective pixel, thereby deteriorating the quality of the display apparatus.

Generally, organic light emitting devices are fabricated in a clean room, and therefore foreign substances such as dust are prevented from infiltrating during the fabrication process to cause short-circuits due to the anode and the cathode of the organic light emitting device. However, in reality, the clean room cannot perfectly prevent infiltration of foreign substances. Further, short circuit resulting from a structural issue such as a step of the internal structure of the organic light emitting device and the roughness of the stacked layers may not be prevented. For these reasons, failure due to short circuits has not been effectively prevented.

SUMMARY OF THE INVENTION

Accordingly, the present invention is directed to a lighting apparatus using an organic light emitting device and a method of fabricating the same that substantially obviate one or more problems due to limitations and disadvantages of the related art.

The embodiments of the present invention have been devised in view of the above-mentioned problems and other limitations associated with the related art, and an object of the present invention is to provide a lighting apparatus capable of preventing a short circuit created by contact between a first electrode and a second electrode of an organic light emitting device by forming the first electrode of a high-resistance transparent conductive material having a resistance greater than or equal to a set value, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting device including a first electrode, an organic light emitting layer, and a second electrode is formed on a first substrate, and the first electrode is formed of a transparent conductive material having a resistance of approximately 2800Ω to 5500Ω in each pixel. Thus, even if the resistance of the organic light emitting layer is removed in a pixel due to a contact between the first electrode and the second electrode, overcurrent may be prevented from being applied to the pixel due to the resistance of the first electrode.

The plurality of pixels of the first substrate is partitioned by an auxiliary electrode connected to the first electrode. The auxiliary electrode is arranged in a shape of a matrix, a mesh, an octagon, a hexagon, or a circle with a preset width.

The first electrode may be composed of a conductive polymer such as a conductive polymer such as about poly (3,4-ethylenedioxythiophene):polystyrenesulfonic acid (PEDOT:PSS), a carbon-based material such as graphite (graphene), single wall carbon nanotube (SWCNT), or multiwall carbon nanotube (MWCNT), or a nanowire-based material such as a Cu-nanowire, an Ag-nanowire, or an Au-nanowire.

Further, the lighting apparatus according to an embodiment of the present invention is fabricated by forming a high-resistance conductive material having a resistance of approximately 2800Ω to 5500Ω in each pixel, forming a first electrode of the high-resistance conductive material, and forming an organic light emitting layer and a second electrode on the first electrode.

The operation of forming the high-resistance conductive material may include dissolving the conductive material in approximately 80% to 90% by weight of a solvent, mixing the dissolved conductive material with a binder, and adding an additive to the dissolved conductive material, wherein the solvent may contain water or alcohol, and the conductive material included a conductive polymer, a carbon-based material, or a nanowire-based material, wherein the binder may include a silicone-based binder or an acrylic-based binder, and the additive may include a leveling agent or a surface agent.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, the embodiments of the present invention will be described in detail with reference to the accompanying drawings.

The embodiments of the present invention provide a lighting apparatus including an organic light emitting device made of an organic material, not a lighting apparatus including an inorganic light emitting device made of an inorganic material.

The organic light emitting device made of the organic light emitting material has a relatively good light emission efficiency for green and red, compared to the inorganic light emitting device. In addition, since the width of the emission peak of blue, red and green of the organic light emitting device is greater than that of the inorganic light emitting device, the light emitting apparatus is allowed to provide light further similar to sunlight with an improved color rendering index of the light emitting device.

In particular, the embodiments of the present invention provide a light emitting apparatus having an organic light emitting device capable of preventing the light emission efficiency from being lowered or capable of ensuring emission of light when some pixels of the organic light emitting device are short-circuited.

Figure 1:
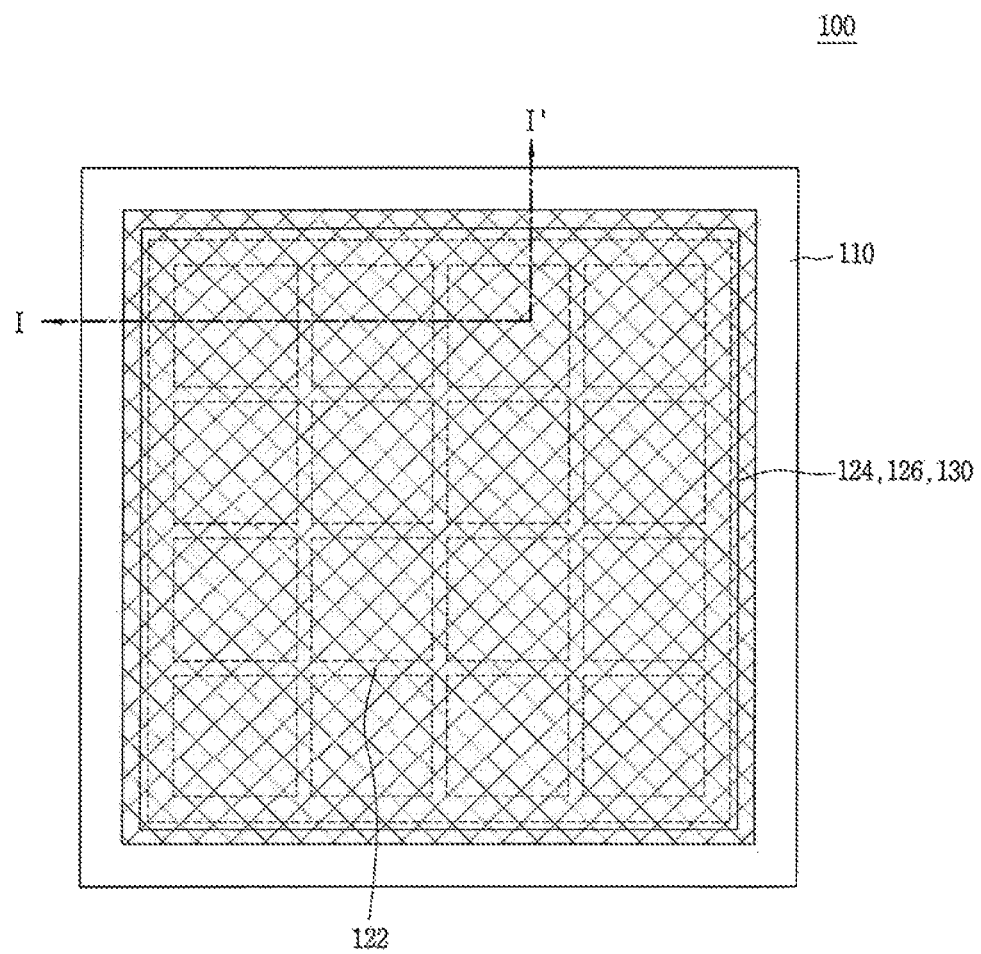
FIG. 1 is a plan view showing a structure of a lighting apparatus according to an embodiment of the present invention.

FIG. 1 is a view showing the structure of a lighting apparatus using an organic light emitting device according to an embodiment of the present invention. All the components of the lighting apparatus according to all embodiments of the present invention are operatively coupled and configured.

As shown in FIG. 1, a lighting apparatus 100 according to the present invention is a surface-emitting lighting apparatus. In the lighting apparatus, a first electrode 124 and a second electrode 126 are disposed over the front surface of a first substrate 110, and an organic light emitting layer 130 is disposed between the first electrode 124 and the second electrode 126 to form an organic light emitting device. In the lighting apparatus 100 having this structure, as a signal is applied to the first electrode 124 and the second electrode 126 of the organic light emitting device, the organic light emitting layer 130 emits light to output the light throughout the first substrate 110.

An auxiliary electrode 122 is arranged in a matrix on the first substrate 110. The auxiliary electrode 122 is made of metal having good conductivity such that a uniform voltage is applied to the first electrode 124 disposed in the entire region of the first substrate 110, thereby enabling emission of light with a uniform luminance from the lighting apparatus 100 having a large area.

The organic light emitting layer 130 is formed of an organic light emitting material that outputs white light. For example, the organic light emitting layer 130 may include a blue organic light emitting layer, a red organic light emitting layer and a green organic light emitting layer, or may have a tandem structure including a blue light emitting layer and a yellow-green light emitting layer. However, the organic light emitting layer 130 of the present invention is not limited to the structure described above, and various structures may be employed therefor.

The organic light emitting layer 130 may also include an electron injection layer and a hole injection layer for injecting electrons and holes respectively into the organic light emitting layer 130 of the present invention, an electron transport layer and a hole transport layer for transporting the injected electrons and holes to the organic light emitting layer, and a charge generating layer for generating charges such as electrons and holes.

First and second pads, which are connected to the first and second electrodes 124 and 126, respectively to allow an external voltage to be applied thereto, are disposed on the first substrate 110. Here, the first and second pads may be formed on one side edge region of the first substrate 110 and may be formed on both side edge regions, respectively. In addition, a plurality of first and second pads may be provided in the edge regions of the four sides of the first substrate 110.

Figure 2:
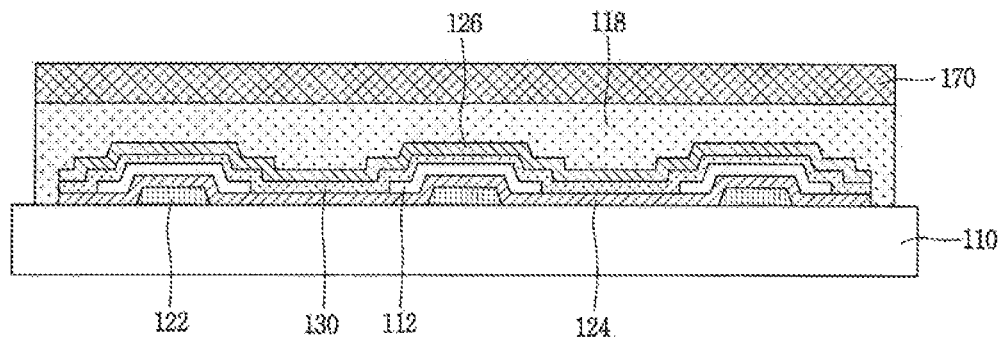
FIG. 2 is a cross-sectional view taken along line I-I' in FIG. 1.

FIG. 2 is a cross-sectional view taken along line I-I' in FIG. 1, and the lighting apparatus 100 according to the present invention will be described in more detail with reference to FIG. 2.

As shown in FIG. 2, the first electrode 124 is disposed on the first substrate 110, which is made of a soft transparent material such as plastic that is bendable or a hard transparent material such as glass. The first electrode 124 may be formed of a transparent conductive material. In this embodiment, the first electrode 124 is formed of a transparent conductive material having a high resistance, and the reason for this will be described in detail later.

First and second pads may be disposed in an edge region of the first substrate 110. Here, the first pad and the second pad may be formed of the same material as that of the first electrode 124 using the same process.

The auxiliary electrode 122 is disposed on the first substrate 110 and is electrically connected to the first electrode 124. Although the first electrode 124 is formed of a transparent conductive material and allows emitted light to be transmitted therethrough, the first electrode 124 has a much greater electrical resistance than that of metal. Therefore, when the large-area lighting apparatus 100 is fabricated, the high resistance of the transparent conductive material makes distribution of the current applied to the wide lighting area non-uniform. The non-uniform distribution of current disables the large-area lighting apparatus 100 to emit light with a uniform luminance.

The auxiliary electrode 122 is disposed in the shape of a matrix, a mesh, a hexagon, an octagon, a circle, or the like with a narrow width throughout the first substrate 110 such that a uniform voltage is applied to the entire electrode 124 of the first substrate 110, thereby enabling the large-area lighting apparatus 100 to emit light having a uniform luminance.

While the auxiliary electrode 122 is illustrated as being disposed under the first electrode 124, the auxiliary electrode 122 may be disposed on the first electrode 124. The auxiliary electrode 122 is made of metal having a good conductivity, such as Al, Au, Cu, Ti, W, Mo, or an alloy thereof. While the auxiliary electrode 122 is illustrated as being configured in a single layer, the auxiliary electrode 122 may be configured in two or more layers.

In addition, the auxiliary electrodes 122 may be disposed in a matrix to divide the first substrate 110 into a plurality of pixels. For example, since the auxiliary electrode 122 has a much lower resistance than that of the first electrode 124, the voltage is applied to the first electrode 124 not through the first pad but through the auxiliary electrode 122. Accordingly, while the first electrode 124 is formed throughout the first substrate 110, the first electrode 124 is divided into a plurality of pixels by the auxiliary electrode 122.

In this embodiment, the auxiliary electrode 122 is formed to have a width of about 40 μm to 60 μm. However, the auxiliary electrode 122 may be determined based on various factors such as the type of the metal used, the area of the lighting apparatus 100, and the size of a pixel.

A protective layer 112 is laminated on top of the first electrode 124 of the first substrate 110. The protective layer 112 is configured to cover the auxiliary electrode 122 and the first electrode 124, which is on the auxiliary electrode 122. Since the auxiliary electrode 122 is made of opaque metal, no light is output through the region where the auxiliary electrode 124 is formed. Accordingly, the protective layer 112 is provided only over the auxiliary electrode 122 and is not disposed on the actual light emitting region (i.e., the pixels), such that light is emitted and output only through the light emitting region of the pixels.

Further, the protective layer 112 is formed so as to surround the auxiliary electrode 122 to reduce the portion stepped by the auxiliary electrode 122 such that the various layers to be formed thereafter will be stably formed without being broken.

The protective layer 112 is configured as an inorganic layer of, for example, SiOx or SiNx. However, the protective layer 112 may be configured as an organic layer of, for example, photoacryl, or may include a plurality of layers of an inorganic layer and an organic layer.

The organic light emitting layer 130 and the second electrode 126 are disposed on the first electrode 124 and the protective layer 112.

The organic light emitting layer 130 may be a white organic light emitting layer and may include a red light emitting layer, a blue light emitting layer, and a green light emitting layer or have a tandem structure including a blue light emitting layer and a yellow-green light emitting layer. The organic light emitting layer 130 may also include an electron injection layer and a hole injection layer for injecting electrons and holes respectively into the organic light emitting layer, an electron transport layer and a hole transport layer for transporting the injected electrons and holes to the organic light emitting layer, and a charge generating layer for generating charges such as electrons and holes.

The organic light emitting layer 130 is formed of a material that emits light in the visible light range by receiving and combining the holes and electrons transported from the hole transport layer and the electron transport layer, respectively, preferably a material having good quantum efficiency for fluorescence or phosphorescence. Examples of such organic materials include, without being limited to, 8-hydroxy-quinoline aluminum complex (Alq3), a carbazole-based compound, a dimerized styryl compound, BAlq, a 10-hydroxybenzoquinoline-metal compound, benzoxazole-based, benzothiazole-based and benzimidazole-based compounds, and poly(p-phenylenevinylene) (PPV).

The second electrode 126 may be formed of metal such as Ca, Ba, Mg, Al, or Ag, or an alloy thereof. A second pad, which is connected to the second electrode 126 to apply a voltage to the second electrode 126, is provided on an outer edge region of the first substrate 110.

The first electrode 124, the organic light emitting layer 130, and the second electrode 126 constitute an organic light emitting device. When the first electrode 124 is an anode of the organic light emitting device, the second electrode 126 is a cathode and a voltage is applied to the first electrode 124 and the second electrode 126, Electrons are injected from the second electrode 126 into the organic light emitting layer 130, and holes are injected from the first electrode 124 into the organic light emitting layer 130. Then, excitons are generated in the organic light emitting layer 130. As the exciton decays, light corresponding to the difference in energy between the LUMO (Lowest Unoccupied Molecular Orbital) and the HOMO (Highest Occupied Molecular Orbital) of the light emitting layer is generated and emitted downward (toward the substrate 110 in the figure).

Since the protective layer 112 is disposed over the auxiliary electrode 122, the organic light emitting layer 130 over the auxiliary electrode 122 does not directly contact the first electrode 124, and thus the organic light emitting device is not formed over the auxiliary electrode 122. In other words, the organic light emitting device in the lighting unit EA is formed only in the pixels between the auxiliary electrodes 122 formed in the shape of, for example, a matrix.

An adhesive 118 is applied to the first substrate 110 having the organic light emitting device and a second substrate 170 is disposed thereon. Thus, as the second substrate 170 is attached to the adhesive 118, the lighting apparatus 100 is sealed. As the adhesive 118, a photocurable adhesive or a thermosetting adhesive may be used. The second substrate 170 may be formed of various materials. As shown in the figure, the adhesive 118 may also be provided on the lateral surfaces of the organic light emitting device to completely seal the organic light emitting device.

The second substrate 170 functions to prevent infiltration of possible contaminants such as moisture, dust or air from the outside, and may be formed of any material capable of performing this function. For example, the second substrate 170 may be formed of a polymer such as PET (polyethylene terephthalate) or may be formed of a thin metal foil such as aluminum.

A protective layer including an organic layer and/or an inorganic layer and a sealant composed of an epoxy compound, an acrylate compound or an acrylic-based compound may be provided on top of the second electrode 126 and on the lateral surface of the organic light emitting device.

In this embodiment, the first electrode 124 may be formed of a transparent conductive material having a high resistance to preventing failure due to short circuit that is created upon electrical contact between the first electrode 124 and the second electrode 126, which will be described in more detail below.

Figure 3A:
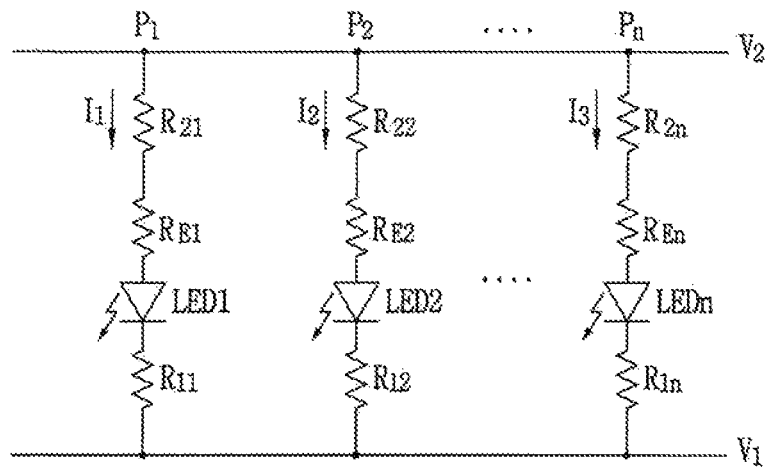
FIG. 3A is a diagram schematically showing a circuit of an organic light emitting device provided in a lighting apparatus.

FIG. 3A is a diagram schematically showing a circuit of an organic light emitting device provided in a lighting apparatus. As shown in FIG. 3A, voltages of $V_1$ and $V_2$ are applied to the first electrode 124 and the second electrode 126, respectively. In addition, a resistor $R_{E1}$, $R_{E2}$, ..., or $R_{En}$ of the organic light emitting layer 130, a resistor $R_{11}$, $R_{12}$, ..., or $R_{1n}$ of the first electrode 124, and a resistor $R_{21}$, $R_{22}$, ..., or $R_{2n}$ of the second electrode 126 are connected in series between the first electrode 124 and the second electrode 126.

The organic light emitting device provided in the lighting apparatus includes a plurality of pixels P1, P2, ..., Pn, which are connected in parallel with other pixels.

In the organic light emitting device having such structure, a plurality of pixels is connected in parallel. Thus, when voltages $V_1$ and $V_2$ are applied to the first electrode 124 and the second electrode 126, respectively, current $I_1$, $I_2$, ..., or $I_n$ is applied to each of the organic light emitting layers LED1, LED2, ..., LEDn of the respective pixels $P_1$, $P_2$, ..., $P_n$, and thus the organic light emitting layers LED1, LED2, ..., LEDn emit light. At this time, voltage V1 of a preset magnitude may be applied to the first electrode 124, and the second electrode 126 may be grounded.

Since substantially the same resistance is formed in the plurality of pixels (the resistances may be different depending on the thickness errors of the electrodes 124 and 126 formed in the respective pixels $P_1$, $P_2$, ..., $P_n$ and the organic light emitting layer 130, but the difference is insignificant), light of substantially the same luminance is emitted from the plurality of pixels, and thus uniform light is output throughout the lighting apparatus.

The organic light emitting layer 130 of the organic light emitting device is formed to have a thickness of several hundred angstroms. Therefore, when foreign substances or the like infiltrate into the organic light emitting layer 130 due to process failure, pinholes or cracks are created in the organic light emitting layer 130, and the first electrode 124 and the second electrode 126 are brought into contact with each other and short-circuited. Further, for the lighting apparatus, a variety of metal layers and insulation layers are formed under the organic light emitting layer 130, and cracks or the like may be created in the organic light emitting layer 130 due to the steps of the metal layers and the insulation layers. Thereby, the first electrode 142 and the second electrode 126 contact each other. In addition, in the lamination process of the organic light emitting layer 130, a luminescent material may be non-uniformly applied due to process failure or process error, and thus the first electrode 124 and the second electrode 126 may be electrically connected to each other.

Figure 3B:
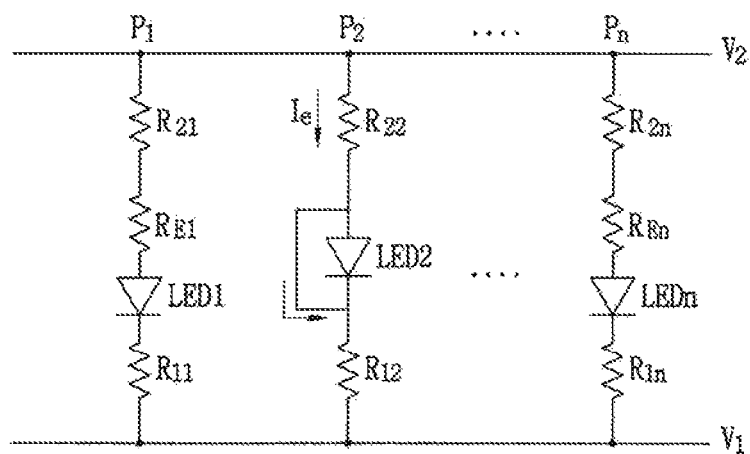
FIG. 3B is a diagram showing a circuit of an organic light emitting device in the case where an electrical short circuit is created between the first electrode and the second electrode.

FIG. 3B is a diagram showing a circuit of an organic light emitting device in the case where an electrical short circuit is created between the first electrode 124 and the second electrode 126.

As shown in FIG. 3B, when the first electrode 124 and the second electrode 126 of one pixel $P_2$ of the plurality of pixels $P_1$, $P_2$, ..., $P_n$ of the organic light emitting device contact each other or are electrically connected to each other, the resistor $R_{E2}$ according to the organic light emitting layer 130 is removed and only the resistors $R_{12}$ and $R_{22}$ according to the conductive materials of the first electrode 124 and the second electrode 126 remain in the pixel.

When the first electrode 124 is formed of a transparent metallic oxide having a relatively good conductivity such as ITO (Indium Tin Oxide) or IZO (Indium Zinc Oxide), the resistance of the resistor $R_{11}, R_{12}, \ldots,$ or $R_{1n}$ of the first electrode 124 is about 20Ω. The resistance of the resistor $R_{21}, R_{22}, \ldots,$ or $R_{2n}$ of the second electrode 126 made of metal is about 0.1Ω. On the other hand, the resistance of the resistor $R_{E1}, R_{E2}, \ldots,$ or $R_{En}$ of the organic light emitting layer 130 is about 1 MΩ. Accordingly, the resistance of the resistor $R_{E1}, R_{E2}, \ldots,$ or $R_{En}$ of the organic light emitting layer 130 is much greater than the resistance of the resistor $R_{11}, R_{12}, \ldots,$ or $R_{1n}$ of the first electrode 124 and the resistance of the resistor $R_{21}, R_{22}, \ldots,$ or $R_{2n}$ of the second electrode 126, and therefore the total resistance Rt1, Rt2, ..., or Rtn of each pixel $P_1, P_2, \ldots, P_n$ is almost equal to the resistance of the resistor $R_{E1}, R_{E2}, \ldots,$ or $R_{En}$ of the organic light emitting layer 130 (Rt≈$R_E$).

Therefore, when the first electrode 124 and the second electrode 126 of the second pixel $P_2$ are brought into contact with each other and thus the second pixel $P_2$ is short-circuited, the resistance $R_{E2}$ of the organic light emitting device is removed and becomes 0. Accordingly, the total resistance Rt2 of the second pixel $P_2$ becomes much less than the total resistances Rt1, ..., or Rtn of the other pixels $P_1, \ldots, P_n$ (Rt2<<Rt1 ... Rtn).

As a result, the current $I_e$ between the first electrode 124 and the second electrode 126 flows mostly through the short-circuited pixel $P_2$, and hardly flows through the other pixels $P_1, \ldots, P_n$. Therefore, the organic light emitting layers of these pixels $P_1, \ldots, P_n$ have rapidly decreased luminance or do not emit light. Of course, even in the case where the lighting apparatus is provided with an auxiliary electrode 122 having a good conductivity, a signal is applied to the first electrode 124 of each of the pixels $P_1, P_2, \ldots, P_n$ substantially through the auxiliary electrode 122, and a specific pixel $P_2$ is short-circuited, reduction in current in the other pixels $P_1, \ldots, P_n$ may be minimized by the auxiliary electrode 122. In this case, however, the other pixels $P_1, \ldots, P_n$ are influenced by the short-circuited pixel $P_2$, and the luminance is lowered throughout the entire light emitting apparatus.

Further, the overcurrent $I_e$ flows through the short-circuited pixel $P_2$, and thus the temperature of the short-circuited region rises, deteriorating the organic light emitting material of the organic light emitting layer 130.

In order to prevent such defects, the first electrode 124 in the present invention is formed of a transparent conductive material having a relatively high resistance, thereby providing each pixel $P_1, P_2, \ldots, P_n$ of the organic light emitting device with a separate short-circuit prevention resistor.

Figure 4A:
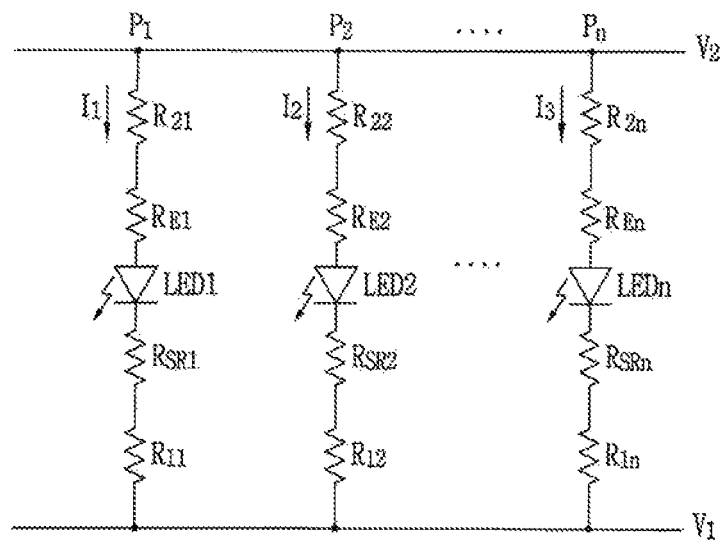
FIGS. 4A and 4B are circuit diagrams of an organic light emitting device having a separate short-circuit prevention resistor.
Figure 4B:
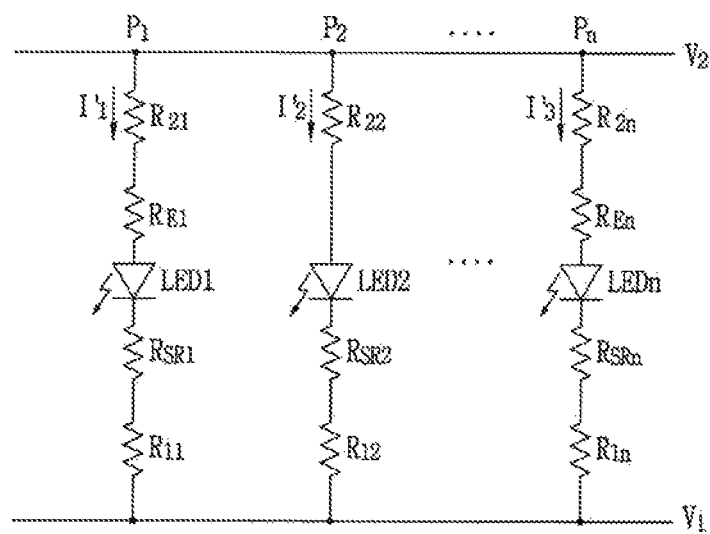

FIGS. 4A and 4B are circuit diagrams of an organic light emitting device having a separate short-circuit prevention resistor.

As shown in FIG. 4A, in each of the plurality of pixels $P_1, P_2, \ldots, P_n$, which are connected in parallel, the resistor $R_{E1}, R_{E2}, \ldots,$ or $R_{En}$ of the organic light emitting layer 130, the resistor $R_{11}, R_{12}, \ldots,$ or $R_{1n}$ of the first electrode 124, the resistor $R_{21}, R_{22}, \ldots,$ or $R_{2n}$ of the second electrode 126, and a short-circuit prevention resistor $R_{SR1}, R_{SR2} \ldots$ or $R_{SRn}$ are connected in series.

In the organic light emitting device having such structure, when voltages $V_1$ and $V_2$ are applied to the first electrode 124 and the second electrode 126, respectively, currents are applied to the organic light emitting layers LED1, LED2, ..., LEDn, and thus the organic light emitting layers LED1, LED2, ..., LEDn emit light.

Since substantially the same resistance is formed in the plurality of pixels $P_1, P_2, \ldots, P_n$, light of substantially the same luminance is emitted from the plurality of pixels, and thus uniform light is output throughout the lighting apparatus.

As shown in FIG. 4B, when the first electrode 124 and the second electrode 126 of one pixel $P_2$ among the plurality of pixels $P_1, P_2, \ldots, P_n$ of the organic light emitting device contact each other, the resistor $R_{E2}$ according to the organic light emitting layer 130 is removed and only the resistors $R_{12}$ and $R_{22}$ according to the conductive materials of the first electrode 124 and the second electrode 126 and the short-circuit prevention resistor $R_{SR2}$ are left in the pixel of the organic light emitting device.

When the first electrode 124 is formed of a transparent metallic oxide having a relatively good conductivity such as ITO (Indium Tin Oxide) or IZO (Indium Zinc Oxide), the resistance of the resistor $R_{11}, R_{12}, \ldots,$ or $R_{1n}$ of the first electrode 124 is about 20Ω. The resistance of the resistor $R_{21}, R_{22}, \ldots,$ or $R_{2n}$ of the second electrode 126 made of metal is about 0.1Ω. On the other hand, the resistance of the resistor $R_{E1}, R_{E2}, \ldots,$ or $R_{En}$ of the organic light emitting layer 130 is about 1 MΩ. Accordingly, when resistor short-circuit prevention resistor $R_{SR1}, R_{SR2}, \ldots,$ or $R_{SRn}$ is not provided, the resistance of the resistor $R_{E1}, R_{E2}, \ldots,$ or $R_{En}$ of the organic light emitting layer 130 is much greater than the resistance of the resistor $R_{11}, R_{12}, \ldots,$ or $R_{1n}$ of the first electrode 124 and the resistance of the resistor $R_{21}, R_{22}, \ldots,$ or $R_{2n}$ of the second electrode 126, and therefore the total resistance Rt1, Rt2, ..., or Rn of each pixel $P_1, P_2, \ldots, P_n$ is almost equal to the resistance of the resistor $R_{E1}, R_{E2}, \ldots,$ or $R_{En}$ of the organic light emitting layer 130 (Rt≈$R_E$).

However, when each pixel is provided with a separate short-circuit prevention resistor $R_{SR1}, R_{SR2}, \ldots,$ or $R_{SRn}$ as shown in FIGS. 4A and 4B, the total resistance Rt1, Rt2, ..., or Rtn of each pixel $P_1, P_2, \ldots, P_n$ is not close to the resistance of the resistor $R_{E1}, R_{E2}, \ldots,$ or $R_{En}$ of the organic light emitting layer 130.

If the short-circuit prevention resistor $R_{SR1}, R_{SR2}, \ldots,$ or $R_{SRn}$ is formed to have a resistance of tens of ohms or less like the resistor $R_{11}, R_{12}, \ldots,$ or $R_{1n}$ of the first electrode 124 and the resistor $R_{21}, R_{22}, \ldots,$ or $R_{2n}$ of the second electrode 126 and thus the resistance thereof is much less than that of the resistor $R_{E1}, R_{E2}, \ldots,$ or $R_{En}$ of the organic light emitting layer 130, the total resistance Rt1, Rt2, ..., or Rtn of each pixel $P_1, P_2, \ldots, P_n$ is almost equal to the resistance of the resistor $R_{E1}, R_{E2}, \ldots,$ or $R_{En}$ of the organic light emitting layer 130.

However, if the resistance of the short-circuit prevention resistor $R_{SR1}, R_{SR2}, \ldots,$ or $R_{SRn}$ is large enough to be meaningful compared to the resistor $R_{E1}, R_{E2}, \ldots,$ or $R_{En}$ of the organic light emitting layer 130, the total resistance Rt1, Rt2, ..., or Rtn of each pixel $P_1, P_2, \ldots, P_n$ is almost equal to the sum of the resistance of the resistor $R_{E1}, R_{E2}, \ldots,$ or $R_{En}$ of the organic light emitting layer 130 and the resistance of the short-circuit prevention resistor $R_{SR1}, R_{SR2}, \ldots,$ or $R_{SRn}$ (Rt1, Rt2, ..., Rn≈$R_{E1}, R_{E2}, \ldots, R_{En}$+$R_{SR1}, R_{SR2}, \ldots, R_{SRn}$).

When the short-circuit prevention resistor $R_{SR1}, R_{SR2}, \ldots, R_{SRn}$ having a resistance greater than or equal to a set value is provided in each of the pixels $P_1, P_2, \ldots, P_n$ as described above, and the first electrode 124 and the second electrode 126 of the second pixel $P_2$, the resistor $R_{E2}$ of the organic light emitting device of the pixel $P_2$ is eliminated and becomes 0, the total resistance Rt2 of the second pixel $P_2$ is substantially equal to the resistance of the short-circuit prevention resistor $R_{SR2}$ (Rt2≈$R_{SR2}$).

Since the resistance of the short-circuit prevention resistor $R_{SR2}$ is not much smaller than the resistance of the resistor $R_{E2}$ of the organic light emitting layer 130, but is meaningful, most of the current between the first electrode 124 and the second electrode 126 does not flow through the short-circuited pixel $P_2$. Instead, a certain amount of current $I'_2$ flows through the pixel $P_2$. At this time, the amount of current flowing through the second pixel $P_2$ is different from the amount of current flowing through the other pixels $P_1, \ldots, P_n$ ($I'_2 \neq I'_1, \ldots, I'_n$) due to the difference in total resistance between the second pixel $P_2$ and the other pixels $P_1, \ldots, P_n$, but the currents flow through all the pixels $P_1, P_2, \ldots, P_n$. Therefore, the luminance of the organic light emitting layers of the plurality of pixels $P_1, P_2, \ldots, P_n$ may be prevented from being drastically reduced or becoming zero.

Particularly, in this embodiment, by properly setting the resistances of the short-circuit prevention resistors $R_{SR1}$, $R_{SR2}, \ldots$, or $R_{SRn}$, a preset current rather than overcurrent is caused to flow through a short-circuited pixel when the first electrode 124 and the second electrode 126 of the pixel among the plurality of pixels $P_1, P_2, \ldots, P_n$ contact each other. Thereby, the luminance of the organic light emitting device may be prevented from being lowered.

According to the present invention, if the resistance of the short-circuit prevention resistor $R_{SR1}$, $R_{SR2}, \ldots$, or $R_{SRn}$ of the organic light emitting device including the plurality of pixels $P_1, P_2, \ldots, P_n$ is about 2800Ω to 5500Ω, a preset current rather than an overcurrent flows through a specific pixel when the first electrode 120 and the second electrode 140 of the pixel contacts each other. Thus, the entire pixels $P_1, P_2, \ldots, P_n$ of the organic light emitting device may emit light.

Figure 5A:
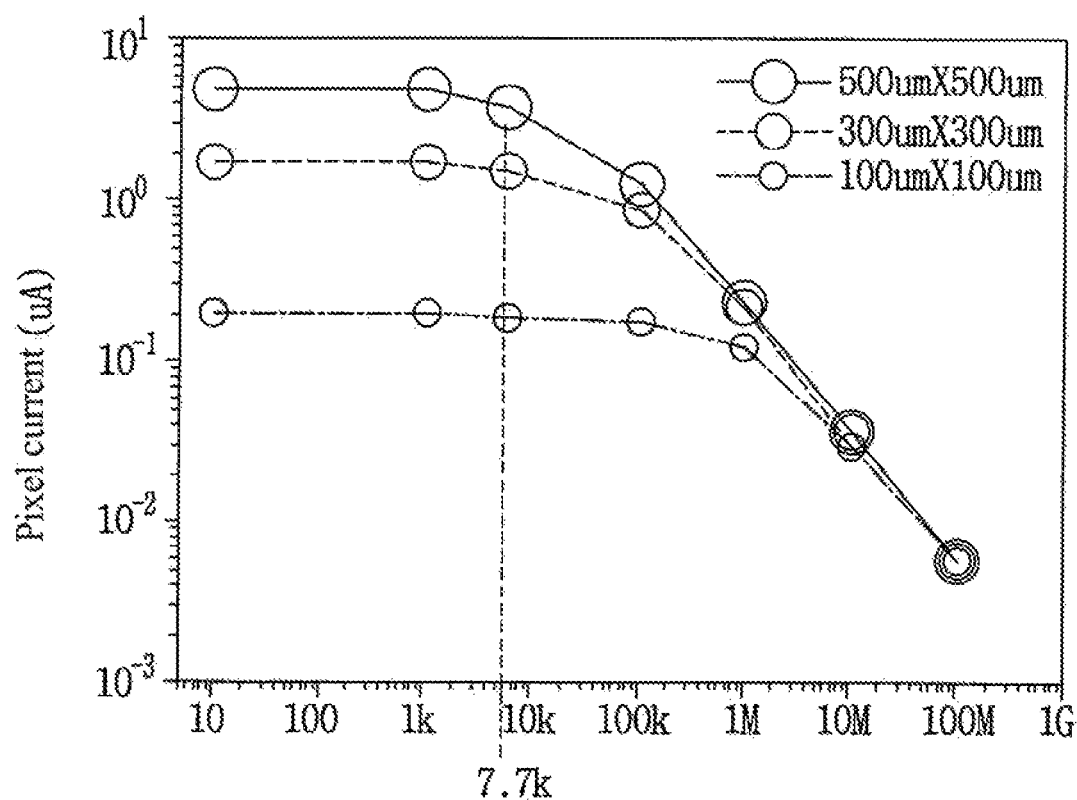
FIG. 5A is a graph depicting a relationship between a pixel current applied to pixels of an organic light emitting device and a short-circuit resistance when short-circuit does not occur in the pixels.
Figure 5B:
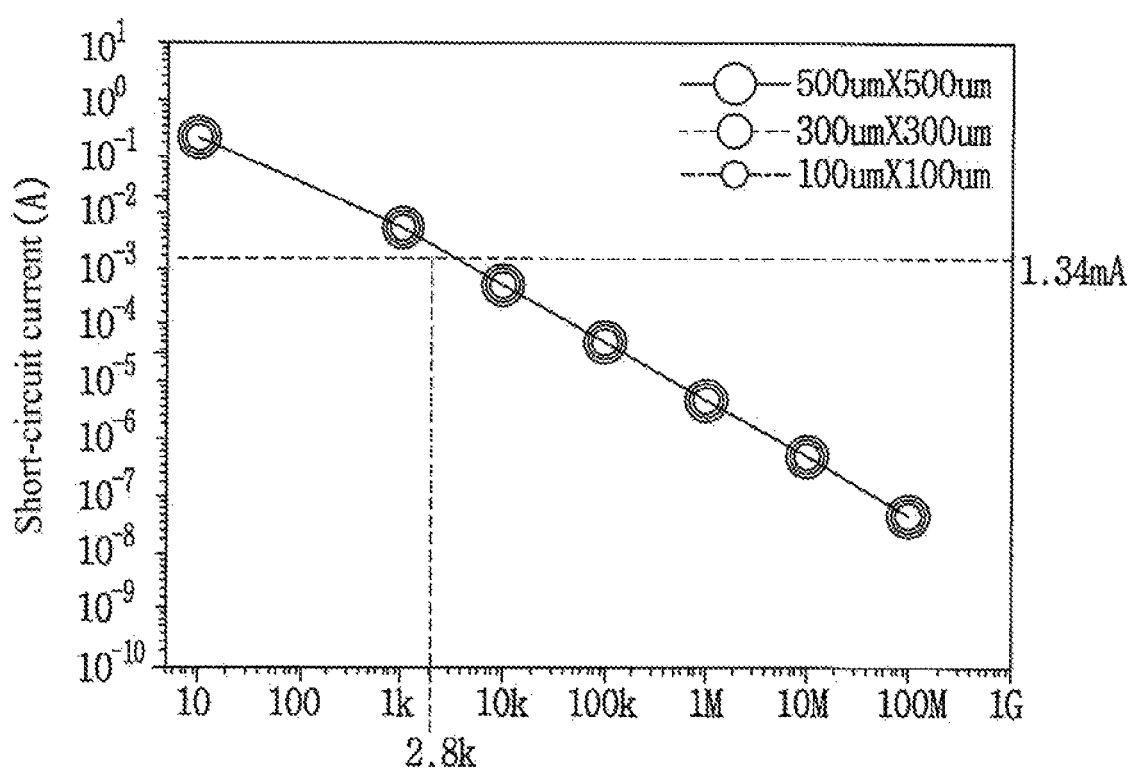
FIG. 5B is a graph depicting a relationship between a short-circuit current applied to a short-circuited pixel of the organic light emitting device and a short-circuit resistance when short-circuit occurs in the pixel.

FIG. 5A is a graph depicting a relationship between a pixel current applied to pixels $P_1, P_2, \ldots, P_n$ of an organic light emitting device and a short-circuit resistance when short-circuit does not occur in the pixels $P_1, P_2, \ldots, P_n$, and FIG. 5B is a graph depicting a relationship between a short-circuit current applied to a short-circuited pixel $P_1$, $P_2, \ldots, P_n$ of the organic light emitting device and a short-circuit resistance when short-circuit occurs in the pixel $P_1, P_2, \ldots, P_n$. The graphs of FIGS. 5A and 5B depict the relationship between a short-circuit resistance and a current when the pixels $P_1, P_2, \ldots, P_n$ have a size of 500 μm×500 μm, 300 μm×300 μm, and 100 μm×100 μm.

As shown in FIG. 5A, when any of the pixels $P_1$, $P_2, \ldots, P_n$ of the organic light emitting device is short-circuited, the organic light emitting device is normally driven, and light is emitted throughout the organic light emitting device. At this time, the current required to normally drive the organic light emitting device depends on the sizes of the pixels $P_1, P_2, \ldots, P_n$. For example, in the case of an organic light emitting device having pixels $P_1$, $P_2, \ldots, P_n$, each pixel having a size of 500 μm×500 μm, the organic light emitting device is normally driven to emit light when a current of about 3.0 μA to 5.0 μA is applied thereto. In the case of an organic light emitting device having pixels $P_1, P_2, \ldots, P_n$, each pixel having a size of 300 μm×300 μm, the organic light emitting device is normally driven to emit light when a current of about 1.5 μA to 1.8 μA is applied thereto. In the case of an organic light emitting device having pixels $P_1, P_2, \ldots, P_n$, each pixel having a size of 100 μm×100 μm, the organic light emitting device is normally driven to emit light when a current of about 0.19 μA to 0.20 μA is applied thereto.

As shown in FIG. 5A, when the resistance of the short-circuit prevention resistor $R_{SR1}, R_{SR2}, \ldots$, or $R_{SRn}$ of each of the pixels $P_1, P_2, \ldots, P_n$ of the organic light emitting device increases, the pixel current applied to the pixels $P_1$, $P_2, \ldots, P_n$ of the organic light emitting device sharply decreases. For example, when the resistance of the short-circuit prevention resistor $R_{SR1}, R_{SR2}, \ldots$, or $R_{SRn}$ increases above 5500Ω, the currents applied to the pixels $P_1$, $P_2, \ldots, P_n$ of the organic light emitting device that have different areas decrease below 3.0 μA, below 1.5 μA, and to 0.19 μA, respectively, and thus the luminance of the organic light emitting device greatly decreases. Accordingly, when the resistance of the short-circuit prevention resistor $R_{SR1}$, $R_{SR2}, \ldots$, or $R_{SRn}$ of each pixel $P_1, P_2, \ldots, P_n$ of the organic light emitting device is greater than or equal to 5500Ω, failure according to decrease in luminance occurs.

As shown in FIG. 5B, when short-circuit occurs in the pixels $P_1, P_2, \ldots, P_n$ of the organic light emitting device, a short-circuit current is applied to the shorted pixel, and thus the organic light emitting device is not normally driven.

According to the present invention, if the short-circuit current flowing through the short-circuited pixel of the organic light emitting device exceeds about 1.34 mA, the current applied to the other pixels sharply decreases due to the overcurrent of the short-circuited pixel, and thus the luminance of the entire organic light emitting device is lowered.

As shown in FIG. 5B, when the resistance of the short-circuit prevention resistor $R_{SR1}, R_{SR2}, \ldots$, or $R_{SRn}$ of each of the pixels $P_1, P_2, \ldots, P_n$ of the organic light emitting device decreases, the short-circuit current applied to the short-circuited pixel sharply increases. For example, when the resistance of the short-circuit prevention resistor $R_{SR1}$, $R_{SR2}, \ldots, R_{SRn}$ is reduced to 2800Ω, the short-circuit current applied to the short-circuited pixel of the organic light emitting device exceeds 1.34 mA, and thus the overall luminance of the organic light emitting device is lowered. When the resistance of the short-circuit prevention resistor $R_{SR1}, R_{SR2}, \ldots$, or $R_{SRn}$ is further reduced below 2800Ω, the short-circuit current further increases, disabling operation of the organic light emitting device. Therefore, when the resistance of the short-circuit prevention resistor $R_{SR1}$, $R_{SR2}, \ldots$, or $R_{SRn}$ of the short-circuited pixel is less than or equal to 2800Ω, operation of the organic light emitting device is disabled by increase in short circuit current.

Since the luminance of the organic light emitting device is greatly reduced when the resistance of the short-circuit prevention resistors $R_{SR1}, R_{SR2}, \ldots$, or $R_{SRn}$ of each of the plurality of pixels $P_1, P_2, \ldots, P_n$ is greater than or equal to 5500Ω, the overall luminance of the organic light emitting device is lowered when the resistance of the short-circuit prevention resistors $R_{SR1}, R_{SR2}, \ldots$, or $R_{SRn}$ of each of the pixels $P_1, P_2, \ldots, P_n$ is less than or equal to 2800Ω, as described above. Accordingly, the range of the resistance of the short-circuit prevention resistors $R_{SR1}, R_{SR2}, \ldots$, or $R_{SRn}$ of each of the plurality of pixels $P_1, P_2, \ldots, P_n$ is preferably 2800Ω≤$R_{SR}$≤5500Ω.

The short-circuit prevention resistors $R_{SR1}, R_{SR2}, \ldots$, $R_{SRn}$ may be configured in various forms. For example, in the case of the lighting apparatus 100 having the structure shown in FIG. 2, a resistive layer having a predetermined resistance, for example a resistance between 2800Ω and 5500Ω, may be provided between the first electrode 120 and the organic light emitting layer 130 and/or between the second electrode 140 and the organic light emitting layer 130, thereby adding the short-circuit prevention resistors $R_{SR1}, R_{SR2}, \ldots, R_{SRn}$ of the respective pixels $P_1, P_2, \ldots, P_n$ of the organic light emitting device. However, in this case, a separate process for forming the resistive layer is added. Thereby, the fabrication process becomes complex and fabrication costs increase. Moreover, the thickness of the organic light emitting device and the lighting apparatus having the same are increased due to the resistive layer.

Further, by adding a resistive pattern having a preset resistance value to each pixel of the lighting apparatus 100 having the structure shown in FIG. 1, the short-circuit prevention resistors $R_{SR1}, R_{SR2}, \ldots, R_{SRn}$ of the respective pixels $P_1, P_2, \ldots, P_n$ may be added.

For example, by adding a separate resistive pattern after electrically separating the auxiliary electrode 122 from the first electrode 124 in each pixel of the lighting apparatus 100 having the structure shown in FIG. 1, the short-circuit prevention resistors $R_{SR1}, R_{SR2}, \ldots, R_{SRn}$ may be added.

Figure 6:
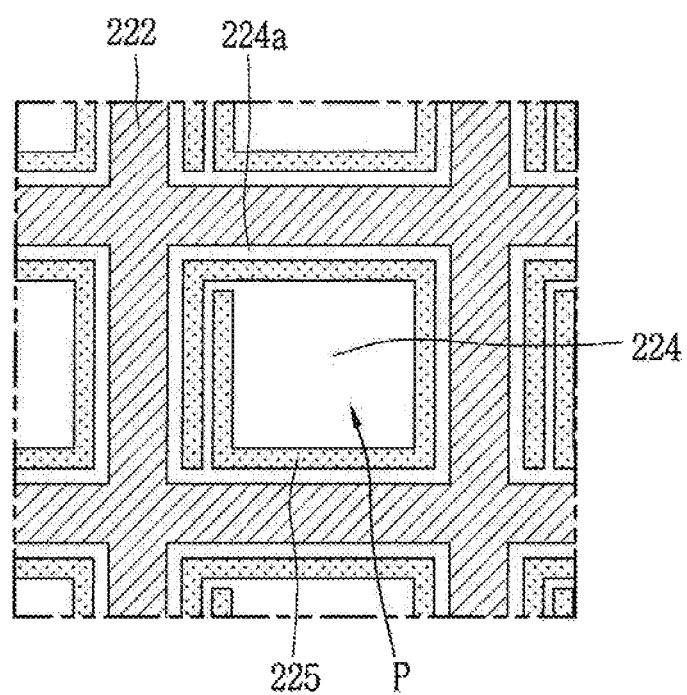
FIG. 6 is a view showing an example of the structure of a lighting apparatus provided with a short-circuit prevention resistor by forming a separate pattern in a pixel.

FIG. 6 is a view showing an example of the structure of a lighting apparatus provided with a short-circuit prevention resistor by forming a separate pattern in a pixel.

As shown in FIG. 6, a first electrode 224 is formed within a pixel P defined by an auxiliary electrode 222 and spaced apart from the auxiliary electrode 222 by a certain distance. The auxiliary electrode 222 and the first electrode 224 are electrically connected by a resistive pattern 224a having a relatively high resistance.

In the lighting apparatus 100 having such structure, the signal applied to the auxiliary electrode 222 is applied to the first electrode 224 via the resistive pattern 224a. Accordingly, the short-circuit prevention resistors $R_{SR1}, R_{SR2}, \ldots, R_{SRn}$ may be formed to have a desired resistance by forming the resistive pattern 224a to be sufficiently long (i.e., by sufficiently increasing the length of the path along which the signal flows).

While it is illustrated in FIG. 6 that the first electrode 224 is formed over the entire lighting apparatus including the top of the auxiliary electrode 222, and an open region 225 where a part of the first electrode 224 is removed is formed to form the resistive pattern 224a of the same material as the first electrode 224, the first electrode 224 and the auxiliary electrode 222 may be formed to be separated from each other and then the resistive pattern 224a may be formed of a material the same as or different from the material of the first electrode 224 in a process different from the process for the first electrode 224.

However, in the case of the lighting apparatus having the separate resistive pattern 224a as described above, light is not emitted from a region where the resistive pattern 224a is formed, and therefore the aperture ratio (the proportion of the light emitting region) is lowered.

In particular, since the resistive pattern 224a should be formed to have a preset width and a preset length in order to form a preset resistance value, the resistive pattern 224a should be formed to have a certain area within a pixel regardless of the area of the pixel. Therefore, for a high-resolution lighting apparatus having a small pixel size, the aperture ratio may be lowered to a set value or less due to the resistive pattern 224a and the lighting apparatus may become defective. Therefore, when the short-circuit prevention resistors $R_{SR1}, R_{SR2}, \ldots, R_{SRn}$ are formed by the resistive pattern 224a, the aperture ratio of the pixels is lowered, making it impossible to fabricate a high-resolution lighting apparatus.

In this embodiment, a separate resistive layer or a separate resistive pattern is not provided. Instead, the first electrode 124 is formed of a conductive material having a high resistance to form the short-circuit prevention resistors $R_{SR1}, R_{SR2}, \ldots, R_{SRn}$ in the respective pixels. In this embodiment, as a separate resistive layer or a separate resistive pattern is not provided, such issues as addition of a process, reduction in aperture ratio, or impossibility of fabrication of a high-resolution lighting apparatus may be addressed.

By setting the transparent high-resistance conductive material used for the first electrode 124 of the present invention to have a resistance of about 2800Ω to 5500Ω in a pixel, the lighting apparatus 100 may be prevented from becoming defective when the pixel is short-circuited due to contact between the first electrode and the second electrode. In this embodiment, any conductive material having a resistance within the aforementioned range can be employed. For example, a conductive polymer, a carbon-based material, a nanowire-based material, or the like may be employed.

Figure 7A:
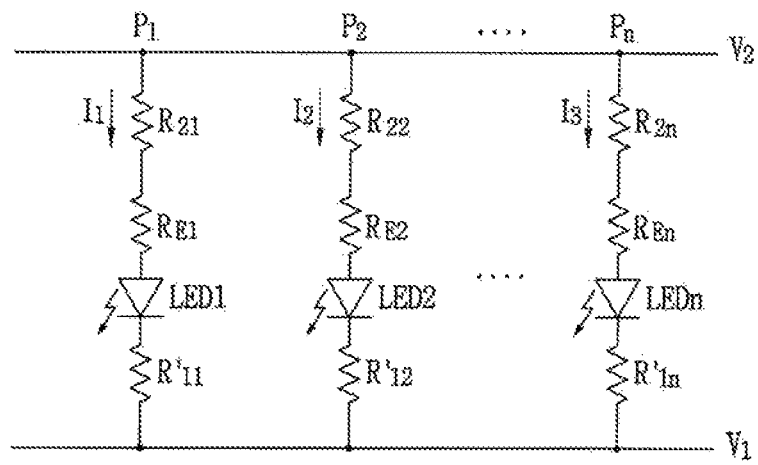
FIGS. 7A and 7B are diagrams showing a circuit of an organic light emitting device according to the present invention having a first electrode formed of a conductive material having a high resistance.
Figure 7B:
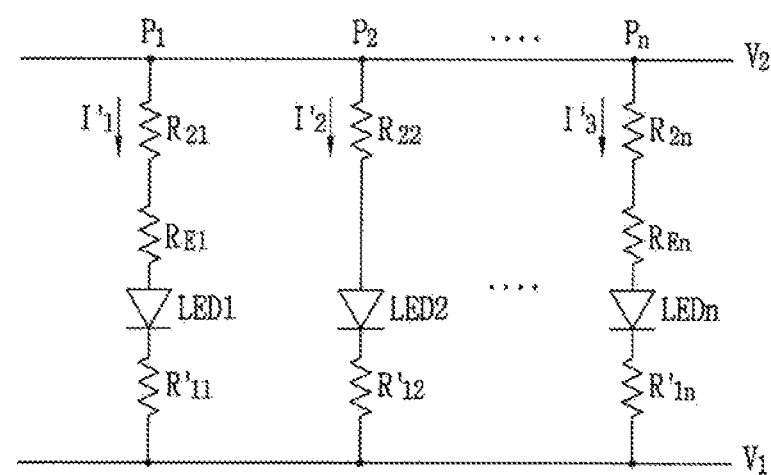

FIGS. 7A and 7B are diagrams showing a circuit of an organic light emitting device according to the present invention having a first electrode 124 formed of a conductive material having a high resistance.

As shown in FIG. 7A, in each of the plurality of pixels $P_1, P_2, \ldots, P_n$, which are connected in parallel, the resistor $R_{E1}, R_{E2}, \ldots,$ or $R_{En}$ of the organic light emitting layer 130, the resistor $R_{11(SR1)}, R_{12(SR2)}, \ldots,$ or $R_{1n(SRn)}$ of the first electrode 124, and the resistor $R_{21}, R_{22}, \ldots,$ or $R_{2n}$ of the second electrode 126 are connected in series. In this case, the resistance of the resistor $R_{21}, R_{22}, \ldots,$ or $R_{2n}$ of the second electrode 126 made of metal such as Ca, Ba, Mg, Al, or Ag or an alloy thereof is about 0.1Ω, and the resistance of the resistor $R_{E1}, R_{E2}, \ldots,$ or $R_{En}$ of the organic light emitting layer 130 is about 1 MΩ. The resistor $R_{11(SR1)}, R_{12(SR2)}, \ldots,$ or $R_{1n(SRn)}$ of the first electrode 124, which is made of a high-resistance conductive material such as a conductive polymer, a carbon-based material, a nanowire-based material, or the like, is about 2800Ω to 5500Ω.

While the organic light emitting device shown in FIG. 4A, that is, the organic light emitting device having a structure with a separate resistive layer or a separate resistive pattern, is provided with a short-circuit prevention resistor, the organic light emitting device shown in FIG. 7A including a high-resistance conductive material does not have a separate short-circuit prevention resistor, but the second electrode 124 has a high resistance and thus serves as a short-circuit prevention resistor.

In the organic light emitting device having such structure, when voltages $V_1$ and $V_2$ are applied to the first electrode 124 and the second electrode 126, respectively, current $I_1, I_2, \ldots,$ or $I_n$ is applied to the organic light emitting layers LED1, LED2, ..., or LEDn of the respective pixels $P_1, P_2, \ldots, P_n$, and thus the organic light emitting layers LED1, LED2, ..., LEDn emit light. At this time, since substantially the same resistance is formed in the plurality of pixels $P_1, P_2, \ldots, P_n$, light of substantially the same luminance is emitted from the plurality of pixels, and thus uniform light is output throughout the lighting apparatus.

As shown in FIG. 7B, when the first electrode 124 and the second electrode 126 of one pixel $P_2$ among the plurality of pixels $P_1, P_2, \ldots, P_n$ of the organic light emitting device contact each other, the resistor $R_{E2}$ according to the organic light emitting layer 130 is removed and only the resistor $R_{12(SR2)}$ of the first electrode 124 according to the high-resistance transparent conductive material of the first electrode 124 and the resistor $R_{22}$ according to the second electrode 126 are left in the pixel of the organic light emitting device.

The resistance of the resistor $R_{11(SR1)}, R_{12(SR2)}, \ldots,$ or $R_{1n(SRn)}$ of the first electrode 124 is about 2800Ω to 5500Ω and the resistance of the resistor $R_{E1}, R_{E2}, \ldots,$ or $R_{En}$ of the organic light emitting layer 130 is about 1 MΩ. Accordingly, even if the resistor $R_{E2}$ of the organic light emitting layer 130 of the second pixel $P_2$ is removed by contact between the first electrode 124 and the second electrode 126, the resistor $R_{12(SR2)}$ according to the high-resistance transparent conductive material of the first electrode 124 remains in the short-circuited second pixel $P_2$. The resistance of the resistor $R_{12(SR2)}$ is not too low to be ignored compared to the total resistance of the other pixels $P_1, \ldots, P_n$.

Therefore, when the first electrode 124 and the second electrode 126 of the second pixel $P_2$ are brought into contact with each other and thus the second pixel P2 is short-circuited, the resistance $R_{E2}$ of the organic light emitting device is removed and becomes 0. Accordingly, the total resistance Rt2 of the second pixel $P_2$ becomes substantially equal to the resistance of the resistor $R_{12(SR2)}$ of the first electrode 124 ($Rt2 \approx R_{12(SR2)}$).

Since the resistance of the resistor $R_{12(SR2)}$ of the first electrode 124 is not much smaller than the resistance of the resistor $R_{E2}$ of the organic light emitting layer 130, but is meaningful, most of the current between the first electrode 124 and the second electrode 126 does not flow through the short-circuited pixel $P_2$. Instead, a certain amount of current $I'_2$ flows through the pixel $P_2$. At this time, the amount of current flowing through the second pixel $P_2$ is different from the amount of current flowing through the other pixels $P_1, \ldots, P_n$ due to the difference in total resistance between the second pixel $P_2$ and the other pixels $P_1, \ldots, P_n$, but the currents flow through all the pixels $P_1, P_2, \ldots, P_n$. Therefore, the luminance of the organic light emitting layers of the plurality of pixels $P_1, P_2, \ldots, P_n$ may be prevented from being drastically reduced or becoming zero.

Particularly, in this embodiment, since the pixels $P_1, P_2, \ldots, P_n$ may be prevented from being short-circuited even without using a separate resistive layer, increase in costs according to addition of a process or decrease in yield may be prevented.

Furthermore, since the pixels $P_1, P_2, \ldots, P_n$ may be prevented from being short-circuited even without using a separate resistive pattern, decrease in the aperture ratio of the lighting apparatus may be prevented.

For example, in a lighting apparatus having pixels each having a size of 500 µm×500 µm, a structure with a resistive pattern has an aperture ratio of about 84.1%, while a structure having a first electrode formed of a high-resistance transparent conductive material as in this embodiment has an aperture ratio of about 93.3%. Thus, the aperture ratio of the lighting apparatus according to this embodiment is higher than the aperture ratio of the lighting apparatus having a structure with a resistive pattern by about 9%.

In addition, in a lighting apparatus having pixels each having a size of 300 µm×300 µm, a structure with a resistive pattern has an aperture ratio of about 74.1%, while a structure having a first electrode formed of a high-resistance transparent conductive material as in this embodiment has an aperture ratio of about 89%. Thus, the aperture ratio of the lighting apparatus according to this embodiment is higher than the aperture ratio of the lighting apparatus having a structure with a resistive pattern by about 15%.

As described above, this embodiment is improved over the structure provided with a resistive pattern in terms of aperture ratio. The degree of improvement in the aperture ratio becomes more apparent in a high-resolution lighting apparatus having a small pixel area.

A lighting apparatus having pixels each having a size of 200 µm×200 µm, a structure with a resistive pattern has an aperture ratio of about 62.1%, while a structure having a first electrode formed of a high-resistance transparent conductive material as in this embodiment has an aperture ratio of about 83.7%. Therefore, while the present invention is applicable to a lighting apparatus having a pixel size of 200 µm×200 µm, the structure provided with a resistive pattern cannot be used for the lighting apparatus having a pixel size of 200 µm×200 µm due to a low aperture ratio.

Hereinafter, a method of fabricating the lighting apparatus 100 according to an embodiment of the present invention will be described in detail with reference to the accompanying drawings.

FIGS. 8A to 8D and FIGS. 9A to 9D are views showing a method of fabricating the lighting apparatus 100 according to an embodiment of the present invention, wherein FIGS. 8A to 8D are plan views and FIGS. 9A to 9D are cross-sectional views.

Figure 8A:
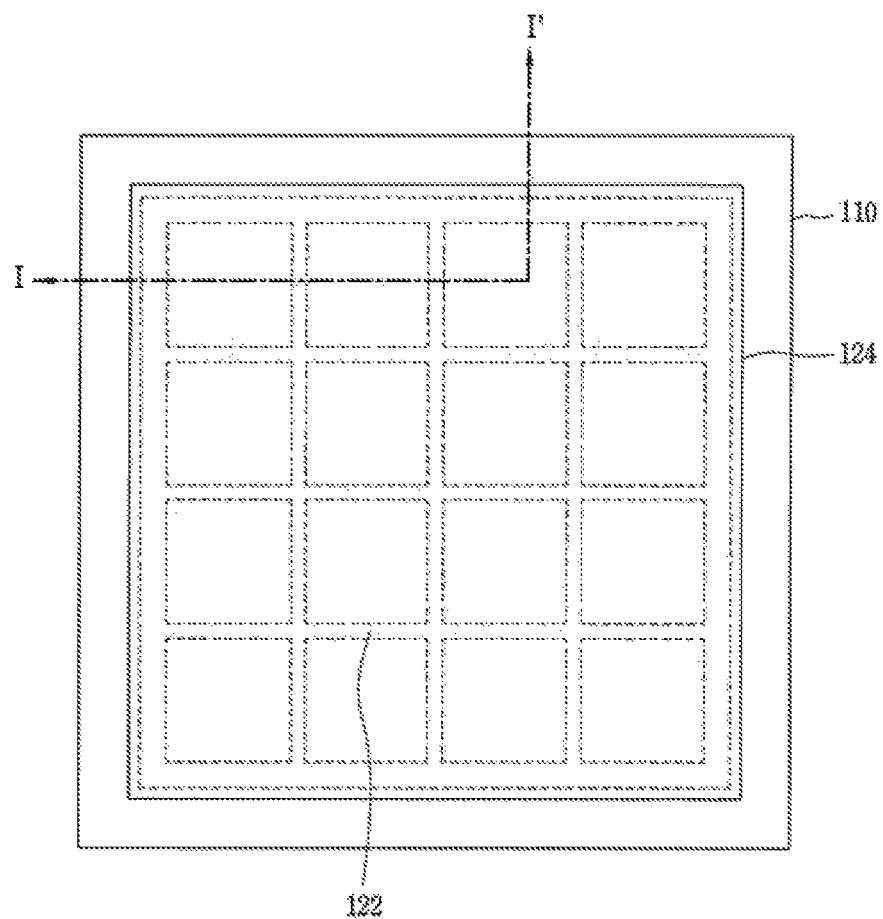
FIGS. 8A to 8D are plan views illustrating a method of fabricating a lighting apparatus according to an embodiment of the present invention.
Figure 9A:
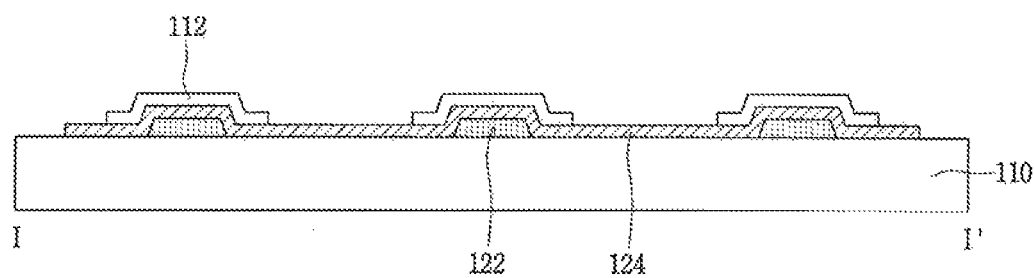
FIGS. 9A to 9D are cross-sectional views illustrating a method of fabricating a lighting apparatus according to an embodiment of the present invention.

First, as shown in FIGS. 8A and 9A, an auxiliary electrode 122 including a single layer or a plurality of layers is formed by laminating metals such as Al, Au, Cu, Ti, W, Mo or an alloy thereof onto the transparent first substrate 110 formed of a material having ductility such as plastics or a hard material such as glass and performing etching. At this time, the auxiliary electrode 122 has a predetermined strip shape and is arranged in a matrix shape in a transverse direction and a longitudinal direction over the entire first substrate 110. However, the auxiliary electrodes 122 may be arranged in the shape of a mesh, a hexagon, an octagon or a circle.

The auxiliary electrode 122 may be formed to have a width of about 45 µm to 55 µm. However, the width of the auxiliary electrode 122 is not limited to a specific value and may be varied according to the area of the lighting apparatus, the size of the pixel, the material of the auxiliary electrode 122, and the like.

Thereafter, a conductive polymer such as about 1% to 10% by weight of poly(3,4-ethylenedioxythiophene):polystyrenesulfonic acid (PEDOT:PSS) is dissolved in a solvent such as about 80% to 90% by weight of water or alcohol, and then a silicone-based binder such as about 10% to 20% by weight of TEOS (tetraethylorthosilicate), SSQ (silsesquioxane) or polysiloxane or an acrylic-based binder is mixed. Then, 1% or less by weight of an additive such as a leveling agent or a surface agent is added to form a transparent conductive material having a high resistance.

Alternatively, a carbon-based material such as about 1% to 10% by weight of graphite (graphene), SWCNT (Single Wall Carbon Nano Tube) or MWCNT (Multi Wall Carbon Nano Tube) is dissolved in a solvent such as about 80% to 90% by weight of water or alcohol, and then a silicone-based binder such as about 10% to 20% by weight of TEOS (tetraethylorthosilicate), SSQ (silsesquioxane) or polysiloxane or an acrylic-based binder is mixed. Then, 1% or less by weight of an additive such as a leveling agent or a surface agent may be added to form a transparent conductive material having a high resistance.

Alternatively, about 1% to 90% by weight of a nanowire-based material such as a Cu-nanowire, an Ag-nanowire or an Au-nanowire is dissolved in a solvent such as about 80% to 90% by weight of water or alcohol, and then a silicone-based binder such as about 10% to 20% by weight of TEOS (tetraethylorthosilicate), SSQ (silsesquioxane) or polysiloxane or an acrylic-based binder is mixed. Then, 1% or less by weight of an additive such as a leveling agent or a surface agent within 1% by weight are added to form a transparent conductive material having a high resistance.

The first electrode 124 is formed by laminating the high-resistance transparent conductive material formed as described above onto the entire first substrate 110 including the top surface of the auxiliary electrode 122 and performing etching. At this time, the first electrode 124 may have a different thickness depending on the kind of the conductive material. For example, when a conductive polymer is used as the conductive material, the first electrode 124 may be formed to have a thickness of about 150 to 200 nm. When a carbon-based material is used as the conductive material, the first electrode 124 may be formed to have a thickness of about 50 to 100 nm.

Thereafter, an inorganic insulating material or an organic insulating material is laminated onto the first electrode 124 and etching is performed to form the protective layer 112 on the first electrode 124 on top of the auxiliary electrode 122. Here, the protective layer 112 may be composed of a single layer of an inorganic insulation layer or an organic insulation layer, but may include a plurality of layers of an inorganic insulation layer and an organic insulation layer.

Figure 8B:
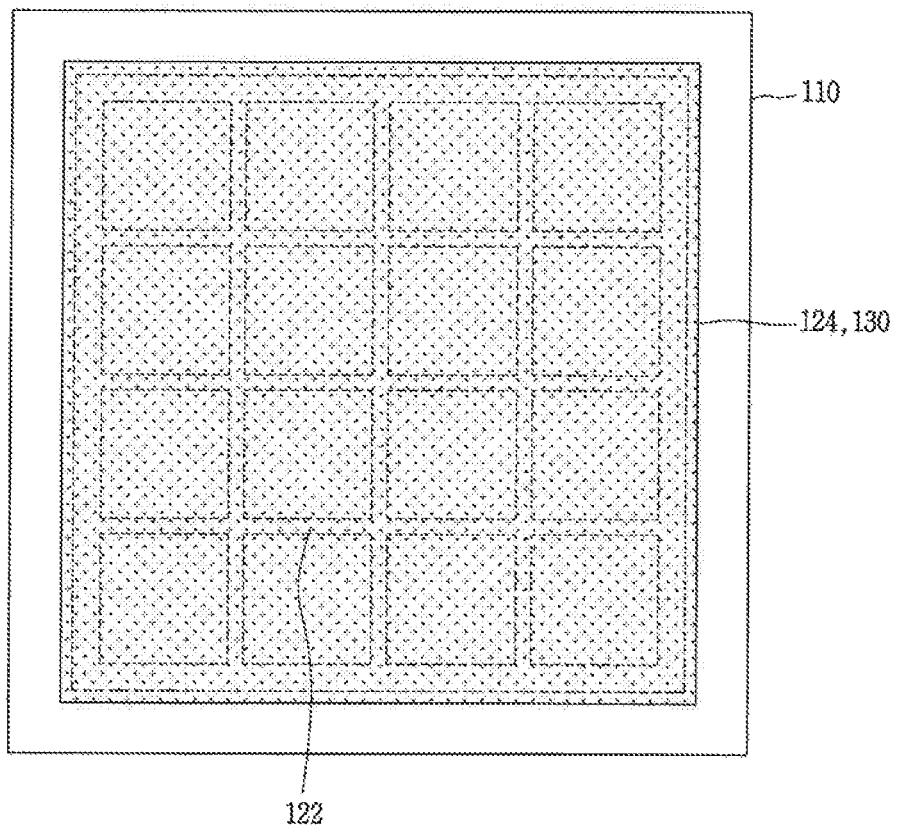
Figure 9B:
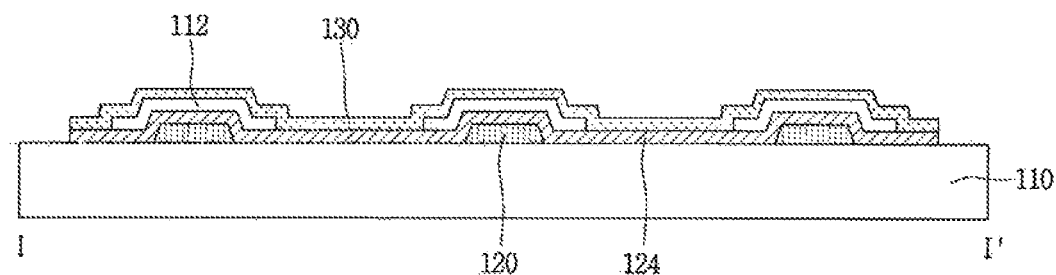

Subsequently, as shown in FIGS. 8B and 9B, an organic light emitting material is deposited on the first substrate 110 to form the organic light emitting layer 130. At this time, the organic light emitting layer 130 may be formed by disposing a mask on a mother substrate on which a plurality of lighting apparatuses is formed and then depositing an organic light emitting material.

Figure 8C:
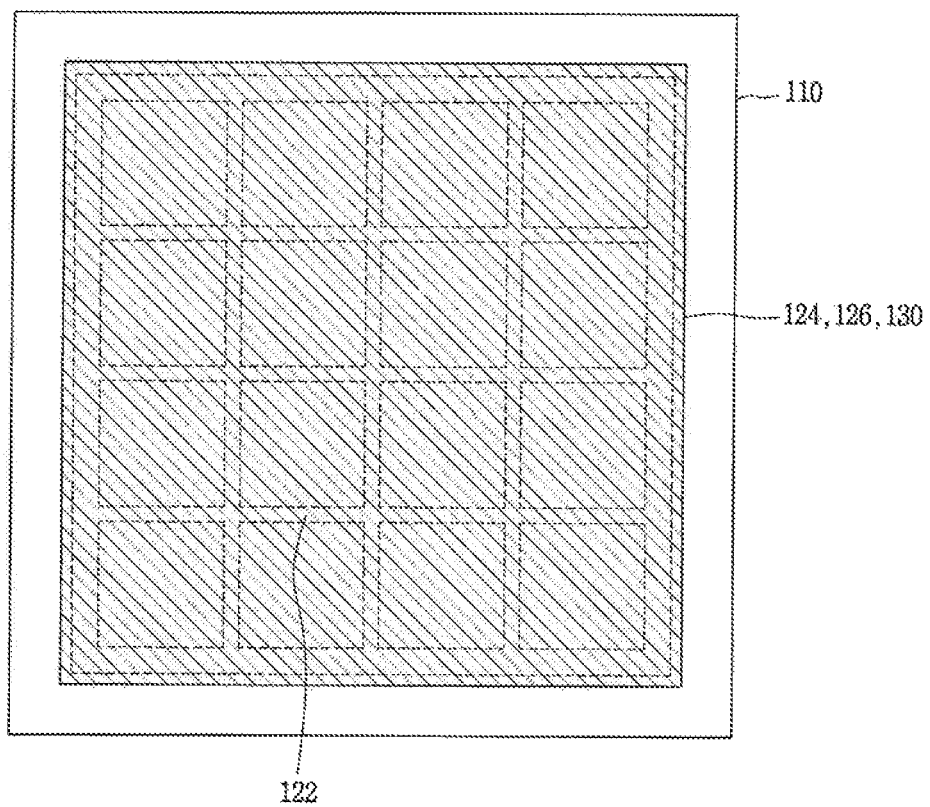
Figure 9C:
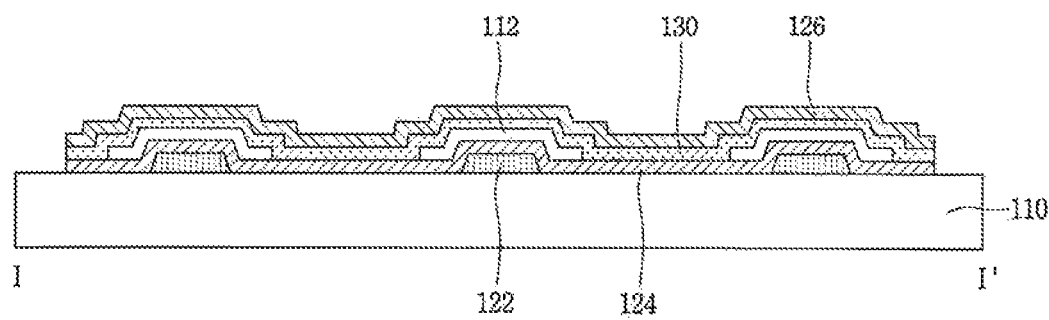

Subsequently, as shown in FIGS. 8C and 9C, metal such as Ca, Ba, Mg, Al or Ag is deposited on the organic light emitting layer 130 and etched to form the second electrode 126.

Figure 8D:
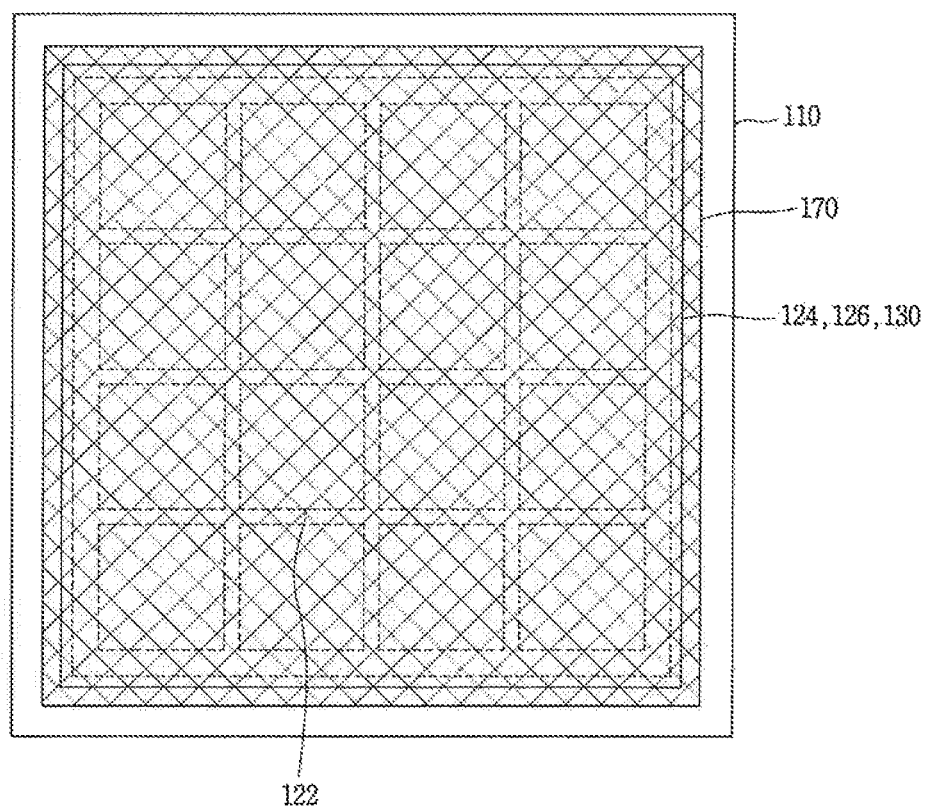
Figure 9D:
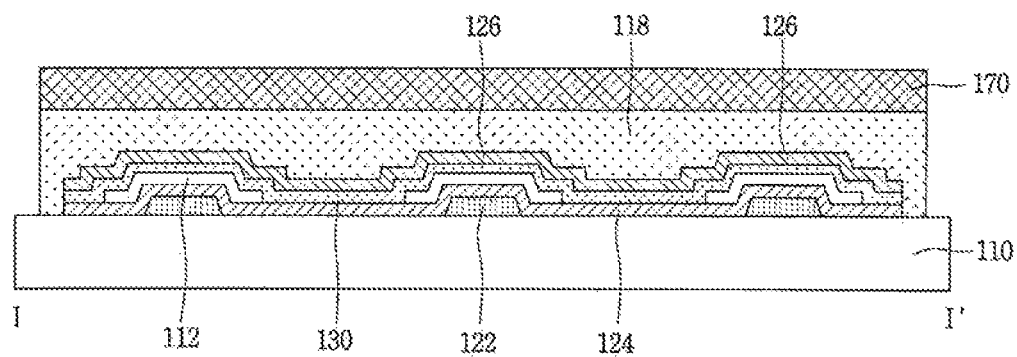

Thereafter, as shown in FIGS. 8D and 9D, an adhesive 118 formed of a photocurable adhesive material or a thermosetting adhesive material is applied to the first substrate 110, and a second substrate 170 is positioned thereon. Thereafter, the second substrate 170 is attached by curing the adhesive 118 and then the first substrate 110 and the second substrate 170 which are attached together are cut to separate a completed lighting apparatus 100, thereby completing each of the lighting apparatuses 100. As the second substrate 170, a polymer film such as PET, a thin metal foil, glass, or the like may be used.

As described above, in the embodiments of the present invention, since a transparent conductive material having a high resistance is employed for the first electrode, the first electrode itself serves as a short-circuit prevention resistor even without a separate resistive layer or resistive pattern, defects may be prevented from being produced by short-circuiting of the organic light emitting device even when the first electrode and the second electrode are brought into contact with each other.

Further, since no separate resistive layer is provided, increase in costs according to addition of a process or decrease in yield may be prevented or minimized according to the embodiments of the present invention. Further, since no separate resistive pattern is provided, decrease in the aperture ratio of the lighting apparatus may be prevented or minimized according to the embodiments of the present invention. In particular, the embodiments of the present invention may be usefully employed in a high-resolution lighting apparatus having a pixel area of 300 µm×300 µm or less.

As is apparent from the above description, according to the embodiments of the present invention, a first electrode forming an organic light emitting device is formed of a transparent conductive material having a high resistance, thereby preventing the organic light emitting device from being short-circuited even when the first electrode and the second electrode of the organic light emitting device come into contact with each other. Thus, application of overcurrent through the pixels where the contact occurs may be prevented from lowering the luminance of the lighting apparatus or disabling the lighting apparatus.

In particular, according to the embodiments of the present invention, a short circuit due to contact between the first electrode and the second electrode may be prevented even without separately forming a resistive layer or a resistive pattern. Therefore, the fabrication process may be prevented from becoming complex or decrease in the aperture ratio may be prevented.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A lighting apparatus comprising:
a first substrate comprising a plurality of pixels; an organic light emitting device disposed on each of the plurality of pixels of the first substrate, the organic light emitting device comprising a first electrode over the first substrate, an organic light emitting layer over the first substrate, and a second electrode over the organic light emitting layer; and
an auxiliary electrode disposed on the first substrate and directly connected to the first electrode,
wherein the first electrode is formed of a transparent conductive material having a resistance of approximately 2800Ω to 5500Ω in each of the plurality of pixels, and
wherein the auxiliary electrode defines the plurality of pixels, and the first electrode is integrally disposed throughout the plurality of pixels.

2. The lighting apparatus according to claim 1, wherein the auxiliary electrode is arranged in a shape of a matrix, a mesh, an octagon, a hexagon, or a circle with a preset width.

3. The lighting apparatus according to claim 1, wherein the first electrode is formed of a conductive polymer.

4. The lighting apparatus according to claim 3, wherein the conductive polymer comprises poly(3,4-ethylenedioxythiophene):polystyrene sulfonic acid (PEDOT:PSS).

5. The lighting apparatus according to claim 1, wherein the first electrode is formed of a carbon-based material.

6. The lighting apparatus according to claim 5, wherein the carbon-based material comprises a material selected from the group consisting of graphite (graphene), single wall carbon nanotube (SWCNT), and multiwall carbon nanotube (MWCNT).

7. The lighting apparatus according to claim 1, wherein the first electrode is formed of a nanowire-based material.

8. The lighting apparatus according to claim 7, wherein the nanowire-based material comprises a material selected from the group consisting of a Cu-nanowire, an Ag-nanowire, and an Au-nanowire.

9. The lighting apparatus according to claim 1, wherein the first substrate is formed of a flexible film.

10. The lighting apparatus according to claim 1, wherein the first substrate is formed of glass.

11. The lighting apparatus according to claim 1, further comprising a second substrate attached to the first substrate by an adhesive.

12. The lighting apparatus according to claim 11, wherein the second substrate is formed of a polymer film, a metal foil, or glass.

13. The lighting apparatus according to claim 1, further comprising;

a protective layer disposed on the first electrode in a region where the auxiliary electrode and the first electrode are overlapped.

\* \* \* \* \*